United States Patent
Chen

(10) Patent No.: US 6,426,621 B1
(45) Date of Patent: Jul. 30, 2002

(54) METHOD AND APPARATUS FOR GENERATING AN OUTPUT VOLTAGE BY DETECTING MAGNETIC FIELD

(75) Inventor: Bo Su Chen, Freeport, IL (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 09/653,835

(22) Filed: Sep. 1, 2000

Related U.S. Application Data

(63) Continuation of application No. 09/102,469, filed on Jun. 22, 1998, now abandoned.

(51) Int. Cl.[7] ............................................. G01R 33/02
(52) U.S. Cl. ................................. 324/244; 324/260
(58) Field of Search ............................... 324/244–249, 324/251, 252, 260, 209; 73/DIG. 4, 778, 779, 24.01, 24.06

(56) References Cited

U.S. PATENT DOCUMENTS

| | | | |
|---|---|---|---|
| 4,500,838 A | 2/1985 | Bloomer | 324/117 R |
| 4,992,659 A * | 2/1991 | Abraham et al. | 250/306 |
| 5,675,252 A * | 10/1997 | Podney | 324/244 |
| 5,731,703 A | 3/1998 | Bernstein | 324/256 |
| 5,739,686 A | 4/1998 | Naughton | 324/259 |

FOREIGN PATENT DOCUMENTS

| | | | |
|---|---|---|---|
| GB | 1 279 091 A | | 6/1972 |
| JP | 1185463 | * | 7/1989 |

* cited by examiner

*Primary Examiner*—Jay Patidar
(74) *Attorney, Agent, or Firm*—Andrew A. Abeyta; Roland W. Norris

(57) ABSTRACT

A method and apparatus for sensing a presence of a magnetic field and/or a magnitude of a magnetic flux density of the magnetic field. A direct-current voltage is applied across a first layer of a conductive material, so that a direct current flows in a first direction through the first layer. A second layer of a piezoelectric material is integrated with or positioned adjacent or abutting the first layer. The first layer and the second layer are exposed to or positioned within a magnetic field. A Lorentz force is thus caused, preferably in a direction which is generally perpendicular to the first direction of the direct current and a second direction of the magnetic field to deflect the piezoelectric material thereby causing an output voltage in response to the Lorentz force. A magnetic flux density can be calculated as a function of the piezoelectric output.

20 Claims, 1 Drawing Sheet

METHOD AND APPARATUS FOR GENERATING AN OUTPUT VOLTAGE BY DETECTING MAGNETIC FIELD

This is a continuation of Ser. No. 09/102,469 filed Jun. 22, 1998 now abandoned.

BACKGROUND OF THE INVENTION

1. Field of the Invention

This invention relates to a method and an apparatus for sensing a magnetic field and for detecting a magnetic flux density, each as a function of a measured Lorentz force.

2. Discussion of Related Art

Hall sensors have been used to sense magnetic fields. Hall effect transducers have been used with pole pieces and biasing magnets to increase sensitivity of the Hall sensors. When used with a magnet, a pole piece tends to channel a magnetic field and thus change flux densities in a magnetic circuit.

U.S. Pat. No. 4,992,659 discloses a microscopy apparatus for measuring Lorentz force-induced deflection of a tip of a scanning tunneling microscope to image magnetic structures of a sample. Motion of the tip, which indicates the presence of a magnetic field, is optically detected. The magnetic field measurement and a tip position are received by a computer which provides an output signal to a device for graphically representing the magnetic field at different positions on a surface of the sample.

U.S. Pat. No. 5,675,252 discloses a piezomagnetometer which uses a magnetoelectric composite structure, formed by alternating layers of piezoelectric and magnetostrictive material, to convert a fluctuating magnetic field directly to electric current. An ambient magnetic field strains magnetostrictive layers which stresses piezoelectric layers and drives a polarization current proportional to an amplitude of the magnetic field.

It is apparent that there is a need for a method and apparatus that enables a microelectronic structure to sense a magnetic field and to measure a magnetic flux density. There is also a need for a method and apparatus that produces a significantly higher output voltage, as compared to conventional methods and apparatuses, when exposed to the same magnetic field.

SUMMARY OF THE INVENTION

It is one object of this invention to provide a method and apparatus that uses a Lorentz force and a piezoelectric effect to detect the presence of a magnetic field and to measure a magnetic flux density of the magnetic field.

It is another object of this invention to provide a microelectronic structure that detects the presence of a magnetic field and measures a magnetic flux density of the magnetic field.

It is still another object of this invention to provide a method and apparatus that produces a significantly higher output voltage signal, as compared to known methods and apparatuses, when exposed to the same magnetic field.

The above and other objects of this invention are accomplished with a method for sensing a magnetic field wherein a direct-current voltage is applied across a first layer of a conductive material. A direct current flows in a first direction through the first layer. A second layer of piezoelectric material is either integrated with or is adhered to the first layer. The first layer and the second layer are positioned within or exposed to the magnetic field. A Lorentz force generated in a second direction, which is preferably but not necessarily generally perpendicular to the first direction, is generated causing the piezoelectric material to deflect. The presence of a magnetic field and/or a magnetic flux density of the magnetic field can be calculated as a function of the measured Lorentz force.

In one preferred embodiment according to this invention, the direct current is in a range of about 0.1 mA to about 10 mA, and preferably about 3 mA. Also in a preferred embodiment of this invention, a magnitude of the magnetic flux density is in a range of about 100 Gauss to about 1,000 Gauss, preferably about 400 Gauss.

The first layer of the conductive material and the second layer of the piezoelectric material can be moved within the magnetic field into a position where the magnitude of the Lorentz force is at a maximum value. In such position where the Lorentz force is at a maximum value, the two vectors representing the direct current and the magnetic field are at a right angle with respect to each other. The Lorentz force is generated in a direction which is preferably generally perpendicular to the directions of the vectors of the direct current and the magnetic field.

In one preferred embodiment according to this invention, an apparatus for sensing a magnetic field comprises the first layer of the conductive material integrated with, or applied to, the second layer of the piezoelectric material, such as by a sputtering technique or other suitable deposition technique. As the layer of piezoelectric material changes shape it produces a change in voltage. A sensor can then measure the Lorentz force generated by measuring the voltage. A computer is preferably used to receive the transducer output signal corresponding to the measured Lorentz force. The computer then calculates either the presence of a magnetic field or a magnitude of the magnetic flux density, as a function of the measured Lorentz force, using any suitable analog and/or digital circuit.

BRIEF DESCRIPTION OF THE DRAWINGS

The above-mentioned and other features and objects of this invention will be better understood from the following detailed description when taken in view of the drawings wherein.

DESCRIPTION OF PREFERRED EMBODIMENTS

Figure 1:
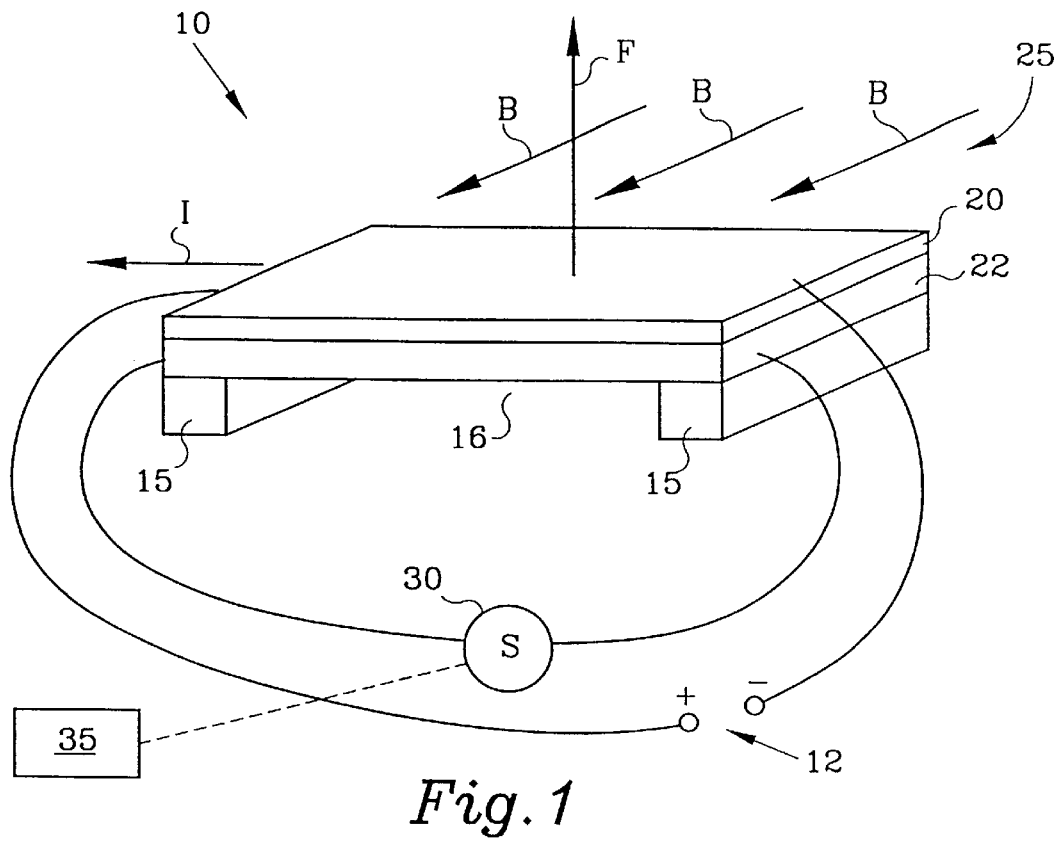
FIG. 1 is a perspective schematic diagram of an apparatus according to one preferred embodiment of this invention.

Apparatus 10, which is used to sense a presence of magnetic field 25 and/or to measure a magnetic flux density of magnetic field 25, comprises base 15, first layer 20 and second layer 22. The elements are preferably sized, shaped and otherwise designed so that apparatus 10 forms a microelectronic structure. Apparatus 10 and the corresponding method of this invention uses a combination of Lorentz force and piezoelectric effect to determine the presence of magnetic field 25 and/or to measure the magnetic flux density of magnetic field 25. In one preferred embodiment the magnetic flux density is in a selected range of about 100 Gauss to about 1000 Gauss. The physical size, layout and/or materials of the different elements of apparatus 10 can be modified according to the strength of magnetic field 25 and/or the desired output voltage from apparatus 10.

As shown in FIG. 1, second layer 22 spans two support surfaces of base 15, forming gap 16. Second layer 22 is preferably attached to, secured to or otherwise fixed to base 15 so that second layer 22 can deflect in a controlled or consistent fashion. Second layer 22 is constructed of a piezoelectric material, such as polyvinylidene fluoride, a copolymer of a polyvinylidene fluoride, or another suitable material that exhibits a change in voltage or electromotive force as a function of a change in shape. Piezoelectric materials suitable for use with this invention are known to those skilled in the art of microelectronic structures.

As shown in FIG. 1, second layer 22 spans or forms a bridge across the support surfaces of base 15. However, second layer 22 and base 15 can form any other suitable structure that accommodates or allows second layer 22 to deflect or change shape, such as when exposed to or introduced within magnetic field 25. Second layer 22 preferably but not necessarily has an overall strip shape, for example having a length in a range of about 1 mm to about 5 mm, a width in a range of about 0.05 mm to about 0.15 mm and a thickness in a range of about 0.001 mm to about 0.010 mm. Base 15 can have any suitable shape or structure that provides support for second layer 22 and that allows at least a portion of second layer 22 to deflect or otherwise change shape. For example, rather than a spanning beam, second layer 22 may form a cantilever structure having only one end fixed to base 15, wherein second layer 22 extends over gap 16. Base 15 preferably forms gap 16 over which second layer 22 spans.

Base 15 is preferably constructed of a dielectric material, such as silicon, a composite containing silicon, or any other suitable material that has non-conductive properties, as known to those skilled in the art of microelectronic structures. Base 15 can be etched or produced with any other suitable manufacturing processes, also as known to those skilled in the art of microelectronic structures.

First layer 20 is preferably constructed of a conductive material, such as copper, gold and/or aluminum. In one preferred embodiment according to this invention, first layer 20 is applied to second layer 22 using an electrical depositing method, such as a suitable sputtering technique as known to those skilled in the art of microelectronic structures. First layer 20 is positioned adjacent or abuts second layer 22 and thus preferably has similar dimensions to second layer 22.

Voltage source 12 is attached to or across first layer 20 so that a direct current passes through first layer 20, in a first direction. In one preferred embodiment according to this invention, the direct current is in a range of about 0.1 mA to about 100 mA, preferably about 3 mA. Voltage source 12 may comprise a battery or any other suitable direct-current voltage source known to those skilled in the art.

As shown in FIG. 1, sensor 30 is attached to or connected to second layer 22 so that sensor 30 measures a voltage output from the piezoelectric second layer 22 corresponding to Lorentz force F generated in a second direction. In one preferred embodiment of this invention, the second direction of the Lorentz force is generally perpendicular to the first direction of the direct current passing through first layer 20. Sensor 30 may also comprise an output for emitting an output signal which is proportional to a magnitude of the Lorentz force. It will be appreciated that Lorentz force F is maximal when the current and the magnetic field are perpendicular.

Apparatus 10 may also comprise computer means 35 for receiving the output signal and for calculating a presence of magnetic field 25 and/or a magnitude of and/or a direction of the magnetic flux density of magnetic field 25, preferably as a function of the measured Lorentz force. Computer means 35 may comprise any suitable hardware and/or software suitable for storing data and performing mathematic functions and/or algorithms. For example, an open-circuit output voltage (V) of second layer 22 can be calculated according to the following known equation:

$$V = -g(F/wt)(t) = -g(F/W)$$

where F is the magnitude of the Lorentz force, w is the width of second layer 22, t is the thickness of second layer 22, and g is the piezoelectric coefficient mode of second layer 22. According to the above equation, with second layer 22 shaped as a beam with w=0.1 mm, t=0.006 mm, the length (L)=3 mm, and with second layer 22 attached to base 15 at two locations and spanning gap 16, when exposed to magnetic field 25 having a magnetic flux density of 400 Gauss, the measured Lorentz force F is about $36 \times 10^{-6}$ Newton with a 0.8 mV piezoelectric output.

In one preferred embodiment according to this invention, the Lorentz force changes, such as by stretching, the shape of second layer 22. Because second layer 22 behaves as a strain gauge, a signal, such as the 0.8 mV signal, is generated. The 0.8 mV signal is much greater than signals generated from other conventional strain gauges that require further amplification to reach a magnitude similar to the magnitude achieved with apparatus 10 of this invention. For example, a conventional Hall sensor having a similar shape and dimensions would produce an output voltage of about $1.5 \times 10^{-6}$ mV when positioned within a magnetic field having the same magnetic flux density of 400 Gauss.

The Lorentz force F is also expressed according to the following equation:

$$F = (I \times B)L$$

where I is the direct current vector and B is the magnetic field vector. The Lorentz -force F reaches a maximum value when the two vectors I and B are positioned at right angles with respect to each other. Thus in one preferred embodiment of this invention, apparatus 10 is positioned within magnetic field 25 so that the Lorentz force F is in the second direction which is generally perpendicular to the first direction of the direct current vector I and to the third direction of the magnetic field vector B.

Figure 2:
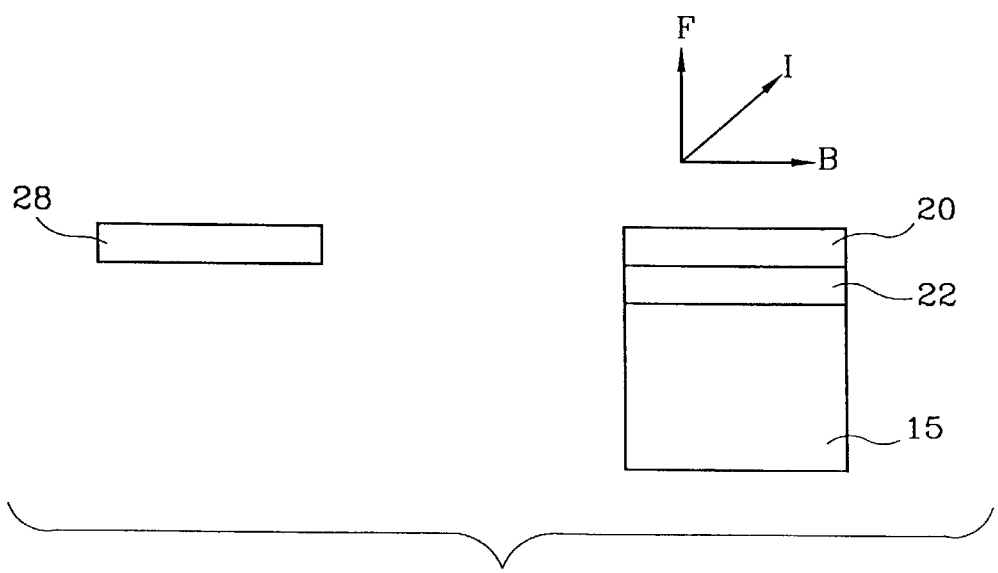
FIG. 2 is a schematic end view of a pole piece positioned near an apparatus, according to one preferred embodiment of this invention.

Referring to FIG. 2, in another preferred embodiment according to this invention, apparatus 10 further comprises pole piece 28 or a bias magnet. Pole piece 28 is used to alter magnetic field 25 of this invention in a fashion similar to how pole pieces are used in combination with conventional Hall sensors.

In one preferred embodiment of a method according to this invention, the direct-current voltage is applied across or to first layer 20 so that the direct current flows or passes through first layer 20, in the first direction. The direct-current voltage and/or the direct current can be measured and varied using meters, circuits and/or voltage devices which are known to persons skilled in the art of microelectronic sensors.

Second layer 22 is adhered and positioned adjacent, or abuts, or is integrated with first layer 20. First layer 20 and second layer 22 are positioned within or exposed to magnetic field 25. In one preferred embodiment, apparatus 10 can be moved or positioned to generate the maximal Lorentz force F by placing the first direction of the direct current perpendicular to the third direction of magnetic field 25. It will be appreciated that F is always perpendicular to the current direction and the magnetic field, and that the strength of F decreases as the perpendicular vector of current to magnetic field decreases.

The generated Lorentz force F deflects second layer 22 which outputs a voltage which is measured as an output signal and is preferably transmitted to computer means 35. The measured Lorentz force F can then be used to detect the presence of magnetic field 25 and/or to measure the magnitude of the magnetic flux density of magnetic field 25.

While in the foregoing specification this invention has been described in relation to certain preferred embodiments thereof, and many details have been set forth for purpose of illustration it will be apparent to those skilled in the art that the invention is susceptible to additional embodiments and that certain of the details described herein can be varied considerably without departing from the basic principles of the invention.

I claim:

1. A method for sensing a magnetic field, comprising:
   (a) applying a direct-current voltage across a first layer of a conductive material wherein a direct current flows in a first direction;
   (b) positioning a second layer of a piezoelectric material adjacent the first layer and within the magnetic field;
   (c) generating a Lorentz force in a second direction generally perpendicular to the first direction to deflect the piezoelectric layer;
   (d) detecting a voltage output of the piezoelectric layer; and
   (e) calculating a magnetic flux density of the magnetic field as a function of the voltage output of the piezoelectric layer as caused by the Lorentz force.

2. A method according to claim 1 further comprising adhering the second layer to the first layer.

3. A method according to claim 1 wherein the direct current is in a range of about 0.1 mA to about 10 mA.

4. A method according to claim 1 wherein the magnetic field is oriented in a third direction generally perpendicular to the first direction.

5. A method according to claim 1 wherein a magnitude of the magnetic flux density is in a range of about 100 Gauss to about 1000 Gauss.

6. A method according to claim 1 wherein the second layer of piezoelectric material acts in a piezoelectric coefficient $g_{31}$ mode.

7. A method according to claim 1 wherein the conductive layer and the piezoelectric layer are oriented with respect to the magnetic field in a position where a magnitude of the Lorentz force is at a maximum value.

8. A method according to claim 1 further comprising prebiasing the Lorentz force by positioning a pole piece near the first layer and the second layer.

9. An apparatus for sensing a magnetic field, comprising:
   a first layer of a conductive material, a voltage source attached to and directing a current in a first direction through the first layer;
   a second layer of a piezoelectric material positioned adjacent the first layer;
   a base structure forming a gap, the second layer attached to the base, at least a portion of the second layer spanning at least a portion of the gap.

10. An apparatus according to claim 9 further comprising:
    means for measuring a voltage output of the piezoelectric material when deflected in response to a Lorentz force generated, and the measuring means emitting an output signal corresponding to the Lorentz force.

11. An apparatus according to claim 10 further comprising:
    computer means for receiving the output signal and calculating a magnetic flux density of a magnetic field as a function of the Lorentz force.

12. An apparatus according to claim 9 wherein the second layer is adhered to the first layer.

13. An apparatus according to claim 9 wherein the conductive material is electrically deposited on a face of the second layer.

14. An apparatus according to claim 9 wherein the conductive material is at least one of a copper material, a gold material and an aluminum material.

15. An apparatus according to claim 9 wherein the piezoelectric material is at least one of a polyvinylidene fluoride and a copolymer of polyvinylidene fluoride.

16. An apparatus according to claim 9 wherein the base includes a dielectric material.

17. An apparatus according to claim 9 wherein the first layer is formed as a first strip and the second layer is formed as a second strip.

18. An apparatus according to claim 9 wherein the first layer is formed as a first strip having a length in a first range of about 1 mm to about 5 mm, a width in a second range of about 0.05 mm to about 0.15 mm, and a thickness in a third range of about 0.001 mm to about 0.010 mm.

19. An apparatus according to claim 9 further comprising at least one of a pole piece and a bias magnet positioned near the first layer and the second layer.

20. An apparatus according to claim 19 wherein the at least one of the pole piece and the bias magnet are fixed with respect to the first layer and the second layer.

* * * * *